US006727651B2

(12) United States Patent
Nemoto et al.

(10) Patent No.: US 6,727,651 B2
(45) Date of Patent: Apr. 27, 2004

(54) TRAVELING WAVE TUBE

(75) Inventors: Akihiko Nemoto, Kanagawa (JP); Hitoshi Nakagawa, Tokyo (JP); Toshihiro Nomoto, Tokyo (JP)

(73) Assignees: NEC Microwave Tube, Ltd (JP); Nippon Hoso Kyokai (JP)

(*) Notice: Subject to any disclaimer, the term of this patent is extended or adjusted under 35 U.S.C. 154(b) by 5 days.

(21) Appl. No.: 10/317,096

(22) Filed: Dec. 12, 2002

(65) Prior Publication Data

US 2003/0117076 A1 Jun. 26, 2003

(30) Foreign Application Priority Data

Dec. 14, 2001 (JP) ....................................... 2001-381260

(51) Int. Cl.[7] ................................................. H01J 25/34
(52) U.S. Cl. ........................ 315/39.3; 315/5.38; 313/39
(58) Field of Search .............................. 315/39.3, 5.38; 313/39

(56) References Cited

U.S. PATENT DOCUMENTS 5,177,394 A * 1/1993 Kubo ........................ 315/5.38
6,291,935 B1 * 9/2001 Suzuki et al. .............. 315/5.38

FOREIGN PATENT DOCUMENTS

| | | |
|---|---|---|
| JP | 58-88762 | 6/1983 |
| JP | 04-359839 | * 12/1992 |
| JP | 2001-118523 | 4/2001 |

OTHER PUBLICATIONS

Japanese Office Action issued Aug. 13, 2003 (w/ English translation of relevation portion).

* cited by examiner

*Primary Examiner*—James Clinger
*Assistant Examiner*—Ephrem Alemu
(74) *Attorney, Agent, or Firm*—Dickstein, Shapiro, Morin & Oshinsky, LLP.

(57) ABSTRACT

Insulating ceramic parts for insulating collector electrodes in a traveling wave tube and a vacuum envelope are formed in a cylindrical shape in which the central axis of the inner diameter diverges from the central axis of the outer diameter and are constructed such that holes are provided in portions of the insulating ceramic parts where the thickness in the radial direction is great, and high-voltage leads for supplying prescribed voltages to said collector electrodes from the exterior pass through these holes.

4 Claims, 4 Drawing Sheets

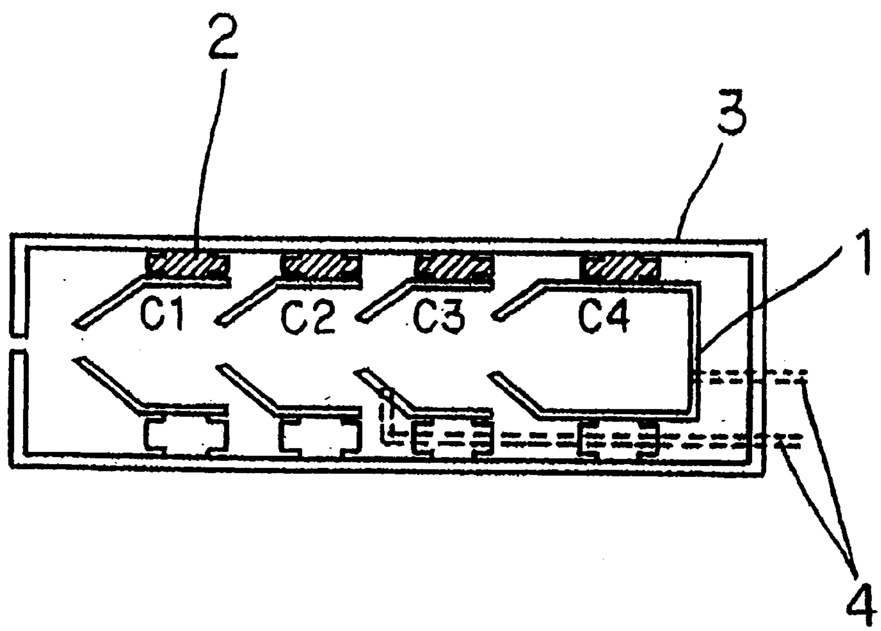
F I G. 4
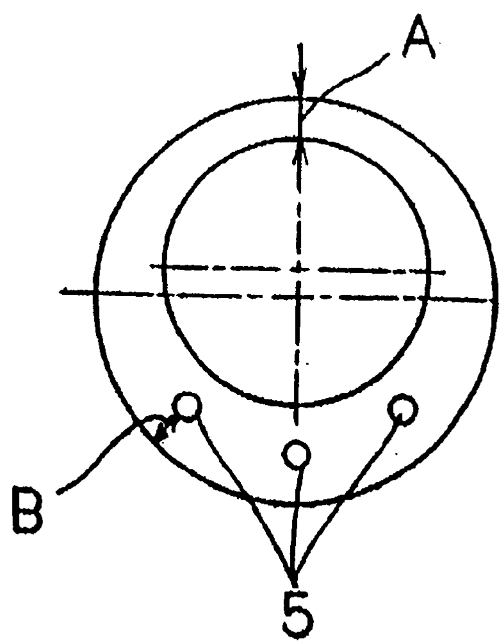
F I G. 5

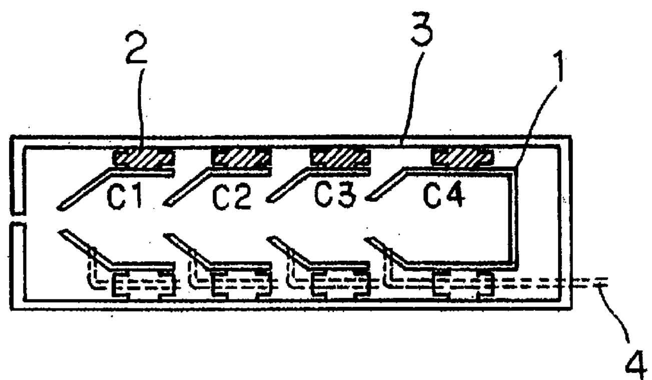
F I G. 6
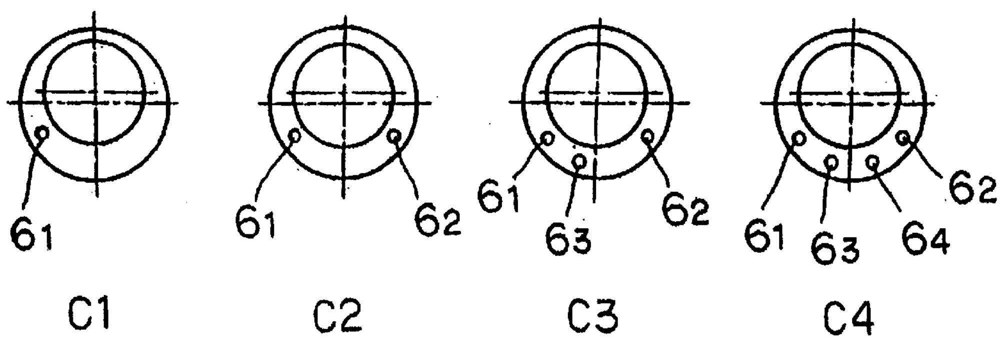
F I G. 7

TRAVELING WAVE TUBE

BACKGROUND OF THE INVENTION

1. Field of the Invention

The present invention relates to a traveling wave tube, and more particularly to a traveling wave tube that is suitable for use in an antenna mounted on a satellite or in a transmitting device that employs a phased-array antenna.

2. Description of the Related Art

In the interest of minimizing heat loss in the collector and thus raising the efficiency of traveling wave tubes that are mounted in artificial satellites or traveling wave tubes that are used in phased-array antennas, a multistage collector structure is adopted in which the collector electrodes are divided into a plurality of units.

In a traveling wave tube having this type of multistage collector structure, different voltages are applied to the collector electrodes of each stage, and electron beams having a velocity distribution as a result of interaction with a high-frequency wave are discriminated and acquired according to the velocity of each.

FIG. 1 is a side view showing an example of the construction of a traveling wave tube, and FIG. 2 is schematic sectional view showing the structure of a collector in the traveling wave tube shown in FIG. 1 showing the relation between the high-voltage leads and the insulating ceramic parts. Further, FIG. 3 is a sectional view showing the construction of an insulating ceramic part that is shown in FIG. 2. FIG. 2 shows a state in which high-voltage leads are routed through the lower-most portion of the insulating ceramic parts, but when four high-voltage leads pass through an insulating ceramic part as shown in FIG. 3, the high-voltage leads are not actually arranged at the lower-most portion but at positions that are slightly higher.

As shown in FIG. 1, the traveling wave tube is made up by: electron gun 50 having cathode 51 for emitting an electron beam; slow-wave circuit unit 60 made up by, for example, helix 61; magnetic focusing unit 70 made up by a periodic magnetic field generation device; input unit 80 for receiving the high-frequency signal that is the object of amplification; output unit 90 for outputting the high-frequency signal that has been amplified; and collector 100 of multistage collector structure.

In this construction, the electron beam that is emitted from cathode 51 advances inside helix 61 while interacting with the high-frequency signal that has been received from input unit 80. A high-frequency signal that has been amplified by interaction with the electron beam is then outputted from output unit 90. The electron beam has an energy distribution, is applied to collector 100, and is acquired at each collector electrode of collector 100.

As shown in FIG. 2, collector 100 of a traveling wave tube of the prior art is a structure in which a plurality of collector electrodes (four stages in FIG. 2) 11 are each bonded and secured by insulating ceramic parts 12 in the radial direction of vacuum envelope 13 that is composed of metal. High-voltage leads 14 are connected to each collector electrode 11 to supply prescribed voltages from the outside, and these high-voltage leads 14 are routed to the outside through holes that are provided in insulating ceramic parts 12.

As shown in FIG. 3, insulating ceramic parts 12 are of a construction formed in a cylindrical shape having uniform thickness in the radial direction so as to maintain a prescribed insulating capacity between vacuum envelope 13, which is connected to the ground potential, and collector electrodes 11, to which high voltages are applied; and in which a plurality of holes 15 are formed for routing the above-described high-voltage leads 14. The central axis of the inside diameter substantially coincides with the central axis of the outside diameter of these insulating ceramic parts 12.

In collector 100 of multistage collector structure, one high-voltage lead 14 passes through insulating ceramic part 12 that supports the first-stage collector electrode (C1 in FIG. 2), and two high-voltage leads 14 pass through insulating ceramic part 12 that supports the second-stage collector electrode (C2 in FIG. 2). Further, three high-voltage leads 14 pass through insulating ceramic part 12 that supports the third-stage collector electrode (C3 in FIG. 2), and four high-voltage leads 14 pass through insulating ceramic part 12 that supports the fourth-stage collector electrode (C4 in FIG. 2). In other words, high-voltage leads 14 do not pass through all of holes 15 provided in insulating ceramic parts 12. Nevertheless, the same number of holes are provided at the same positions such that the same insulating ceramic parts 12 can be used at any stage in collector 100 of the prior art.

In addition, collector 100 shown in FIG. 2 is a construction having an exhaust pipe attached (not shown in the figure), this exhaust pipe normally being affixed in an upper location of FIG. 2, and holes 15 for high-voltage leads in insulating ceramic parts 12 are therefore all formed on the lower side, as shown in FIG. 3.

In recent years, however, there has been an ever-increasing demand for lighter and more compact traveling wave tubes for installation in artificial satellites or phased-array antennas.

In the collector in the above-described traveling wave tube, however, the thickness of the insulating ceramic parts in the radial direction must be equal to or greater than a prescribed thickness depending on the dielectric strength of the insulating ceramic material in order to maintain an insulative property between each of the high-voltage leads and between the collector electrodes and the vacuum envelope.

Reducing the thickness of insulating ceramic parts having holes for routing high-voltage leads has therefore been problematic, and it has been impossible to meet the demand for greater compactness using the construction of the prior art.

SUMMARY OF THE INVENTION

It is an object of the present invention to provide a traveling wave tube in which the diameter of the vacuum envelope is reduced to achieve greater compactness.

To achieve the above-described object, the insulating ceramic parts for insulating the collector electrodes and vacuum envelope in the traveling wave tube of the present invention are formed in a cylindrical shape in which the central axis of the inner diameter diverges from the central axis of the outer diameter. The traveling wave tube of the present invention is further constructed such that holes are provided in those portions having greater thickness in the radial direction, and the high-voltage leads for supplying prescribed voltages to the collector electrodes are routed through these holes.

By means of the above-described construction, the diameter of the vacuum envelope can be made smaller than in the prior art while maintaining a prescribed insulative property between each of the high-voltage leads as well as between the collector electrodes and the vacuum envelope.

A traveling wave tube that is more compact that the prior art can therefore be obtained, and in particular, the use of the traveling wave tube of the present invention in a system in which a multiplicity of antenna elements are arranged, such as in phased-array antenna, contributes greatly to making the system more compact.

The above and other objects, features, and advantages of the present invention will become apparent from the following description with reference to the accompanying drawings, which illustrate examples of the present invention.

BRIEF DESCRIPTION OF THE DRAWING

FIG. 4 is a side sectional view showing the construction of the first embodiment of a collector in a traveling wave tube of the present invention;

FIG. 5 is a sectional view showing the construction of an insulating ceramic part shown in FIG. 4;

FIG. 6 is a schematic sectional view showing the construction of the second embodiment of the collector of a traveling wave tube of the present invention and showing the relation between the insulating ceramic parts and the high-voltage leads; and FIG. 7 is a sectional view showing the construction of an insulating ceramic part that is shown in FIG. 6.

DETAILED DESCRIPTION OF THE PREFERRED EMBODIMENT

First Embodiment

Figure 1:
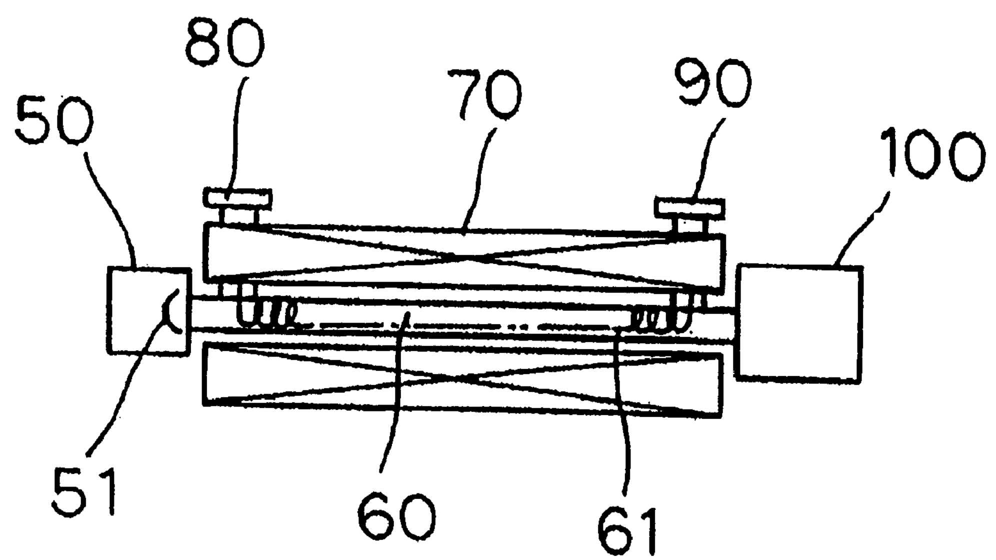
FIG. 1 is a side view showing an example of the construction of a traveling wave tube.
Figure 2:
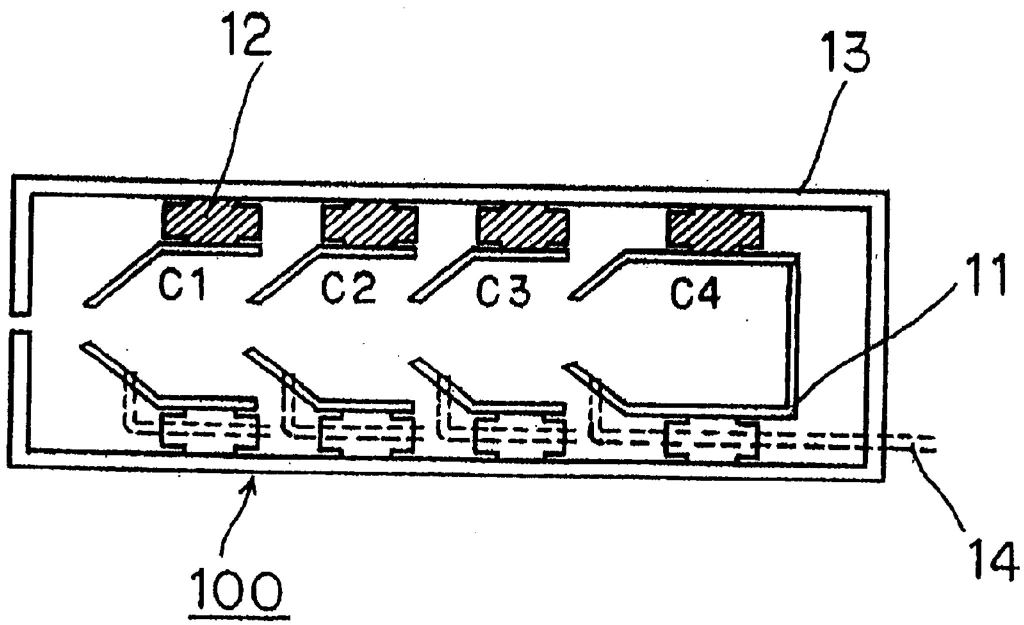
FIG. 2 is a schematic sectional view showing the collector in the traveling wave tube shown in FIG. 1 and showing the relation between the high-voltage leads and insulating ceramic parts.
Figure 3:
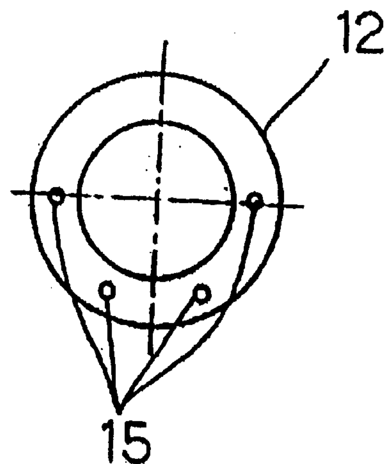
FIG. 3 is a sectional view showing the structure of an insulating ceramic part shown in FIG. 2.

FIG. 4 is a side sectional view showing the construction of the first embodiment of a collector in a traveling wave tube of the present invention; and FIG. 5 is a sectional view showing the construction of an insulating ceramic part shown in FIG. 4. The constitution of the traveling wave tube is similar to that of the prior art, and the explanation will therefore be abbreviated.

As shown in FIG. 4, the collector that is included in the traveling wave tube of the first embodiment is a construction in which, similar to the prior art, a plurality of collector electrodes (four stages in FIG. 4) 1 are bonded and secured by means of insulating ceramic parts 2 in the radial direction of vacuum envelope 3, which is composed of metal. The collector shown in FIG. 4 is structured such that the high-voltage lead that connects to the final-stage collector electrode (C4 in FIG. 4) is led directly to the exterior without passing through insulating ceramic part 2. The number of holes for routing high-voltage leads 4 that are provided in each insulating ceramic part 2 is therefore three.

As shown in FIG. 5, insulating ceramic part 2 of the present embodiment is a construction that is formed in a cylindrical shape in which the central axis of the inner diameter diverges from the central axis of the outer diameter, a plurality of holes 5 for routing high-voltage leads 4 being provided in the portion that is thicker in the radial direction.

The thickness of insulating ceramic part 2 is formed such that a prescribed insulative property can be maintained between each of collector electrodes 1 and vacuum envelope 3 even at the point of least thickness of insulating ceramic parts 2 (point A in FIG. 5).

In addition, holes 5 for routing high-voltage leads 4 are formed at positions such that, of the portions that are interposed between the outer circumference of holes 5 and vacuum envelope 3, the thickness at that portion having the least thickness (position B in FIG. 5) is a thickness that allows maintenance of an insulative property that is equivalent to the insulative property between above-described collector electrode 1 and vacuum envelope 3. In other words, holes 5 for routing high-voltage leads 4 are formed at positions at which the thickness of the portion of least thickness of the portions that are interposed between the outer circumference of holes 5 and vacuum envelope 3 is equal to or greater than the thickness of the point of least thickness of insulating ceramic part 2 in the radial direction. Furthermore, it goes without saying that holes 5 are arranged at prescribed distances necessary for establishing an insulative property between high-voltage leads 4.

The adoption of this form allows a decrease in the diameter of vacuum envelope 3 while maintaining the insulative property between high-voltage leads as well as between collector electrodes 1 and vacuum envelope 3. For example, if a vacuum envelope having a cylindrical shape with a diameter of 17 mm in which the thickness of the insulating ceramic parts is uniform as in the prior art is redesigned according to the construction of the present embodiment, the diameter of the vacuum envelope can be reduced to 14.9 mm, whereby a collector having equivalent insulative properties can be obtained at 88% of the diameter of the prior art.

A traveling wave tube that is more compact than the prior art can thus be obtained. In particular, using the traveling wave tube of the present embodiment in a system such as a phased-array antenna in which a multiplicity of antenna elements are arranged contributes greatly to a realizing more compact system.

Second Embodiment

FIG. 6 is a schematic sectional view showing the construction of the second embodiment of the collector of a traveling wave tube of the present invention and showing the relation between the high-voltage leads and the insulating ceramic parts; and FIG. 7 is a sectional view showing the construction of an insulating ceramic part that is shown in FIG. 6.

The collector shown in FIG. 6 is a construction having four stages of collector electrodes, this being a construction in which each high-voltage lead for applying voltage to each collector electrode passes through holes that are provided in the insulating ceramic parts and led to the outside. FIG. 6 shows a case in which high-voltage leads are routed through the region in which the insulating ceramic parts are thickest in the radial direction (the lowermost portion), but when four high-voltage leads pass through the insulating ceramic parts as in the present embodiment, the high-voltage leads actually pass through points that are slightly higher than the lowermost portion. Apart from this point, the construction is equivalent to that of the first embodiment, and redundant explanation is therefore omitted.

The collector of the present embodiment is constructed such that holes 6 that are provided in the insulating ceramic parts for the passage of the high-voltage leads differ according to the position of the collector electrodes.

As shown in FIG. 7, for example, when the collector is made up from four stages of collector electrodes as shown in FIG. 6, one hole $6_1$ for the passage of the high-voltage lead is provided in the insulating ceramic part that supports the first-stage collector electrode (C1 in FIG. 6), and two holes $6_1$ and $6_2$ are provided in the insulating ceramic part that supports the second-stage collector electrode (C2 in FIG. 6). Further, holes $6_1$–$6_3$ are provided in the insulating ceramic part that supports the third-stage collector electrode (C3 in FIG. 6), and four holes $6_1$–$6_4$ are provided in the insulating ceramic part that supports the last-stage collector electrode (C4 in FIG. 6).

Making the number of holes that are provided in each insulating ceramic part correspond to the number of high-voltage leads that pass through the interior of each insulating ceramic part according to the position of the corresponding collector electrode enables a reduction of the processing required for opening holes in the insulating ceramic parts, and therefore enables a decrease of the unit cost of the insulating ceramic parts and a reduction in the cost of the traveling wave tube.

While preferred embodiments of the present invention have been described using specific terms, such description is for illustrative purposes only, and it is to be understood that changes and variations may be made without departing from the spirit or scope of the following claims.

What is claimed is:

1. A traveling wave tube, comprising:

a plurality of collector electrodes;

a plurality of insulating ceramic parts having a prescribed insulative property for securing said collector electrodes to a vacuum envelope and that are provided corresponding in number to said collector electrodes; and a plurality of high-voltage leads that pass through holes that are provided in said insulating ceramic parts for connecting said collector electrodes to the exterior of said vacuum envelope to supply prescribed voltages to said collector electrodes from said exterior;

wherein:

said insulating ceramic parts are formed in a cylindrical shape in which the central axis of the interior diameter diverges from the central axis of the outer diameter; and said holes are provided at points of greater thickness in the radial direction.

2. The traveling wave tube according to claim 1, wherein said insulating ceramic parts are formed such that, of the portions that are interposed between the outer circumference of said holes and said vacuum envelope, the thickness of the portion having the least thickness is equal to or greater than the thickness of the position having the least thickness in the radial direction.

3. The traveling wave tube according to claim 1, wherein the number of holes that are provided in a said insulating ceramic part is equal to the number of said high-voltage leads that pass through the insulating ceramic part.

4. The traveling wave tube according to claim 2, wherein the number of holes that are provided in a said insulating ceramic part is equal to the number of said high-voltage leads that pass through the insulating ceramic part.

* * * * *